United States Patent [19]

Gary et al.

[11] Patent Number: 5,699,509
[45] Date of Patent: Dec. 16, 1997

[54] METHOD AND SYSTEM FOR USING INVERTED DATA TO DETECT CORRUPT DATA

[75] Inventors: Scott P. Gary, Mountain View; David E. Pope, Los Altos; Tao Chang, Saratoga, all of Calif.

[73] Assignee: Abbott Laboratories, Abbott Park, Ill.

[21] Appl. No.: 484,704

[22] Filed: Jun. 7, 1995

[51] Int. Cl.$^6$ .................................................. G06F 11/00
[52] U.S. Cl. ............................... 395/185.07; 395/185.01
[58] Field of Search .................. 395/185.07, 183.01, 395/183.02, 183.06, 183.07, 183.13, 183.14, 183.18, 184.01, 185.01, 186, 187.01; 364/550, 265, 265.3

[56] References Cited

U.S. PATENT DOCUMENTS

| | | | |
|---|---|---|---|
| 4,656,631 | 4/1987 | Nowak | 395/183.14 |
| 4,782,487 | 11/1988 | Smelser | 371/21.6 |
| 5,361,351 | 11/1994 | Lenkove et al. | 395/700 |
| 5,390,325 | 2/1995 | Miller | 395/700 |
| 5,488,727 | 1/1996 | Agrawal et al. | 395/700 |
| 5,513,315 | 4/1996 | Tierney et al. | 395/183.13 |

FOREIGN PATENT DOCUMENTS

| | | | |
|---|---|---|---|
| 2116818 | 9/1994 | Canada . | |
| 0323123A2 | 7/1989 | European Pat. Off. | G06F 11/00 |
| 0615211A1 | 9/1994 | European Pat. Off. | G07B 17/02 |
| 3312873A1 | 10/1984 | Germany | G11C 7/00 |
| 61-052758 | 3/1986 | Japan | G06F 12/16 |
| 2158622 | 11/1985 | United Kingdom . | |

OTHER PUBLICATIONS

Stroustrup, B., "C$^{++}$ Programming Language," Edition 2, US, New York, Addison Wesley, 1991, 669 blz.; EN, 1992; B. K3B300, S.25, Access Nr: B 0187120; pp. 229–236.

IBM Technical Disclosure Bulletin Jun. 1984, US, "Dual Storage System," Source (C) IBM Corp 1993, An: NA8406360; vol. 27, Nr. 1A, p. 360.

*Primary Examiner*—Hoa T. Nguyen
*Attorney, Agent, or Firm*—Neal D. Marcus; Ronald M. Anderson

[57] ABSTRACT

Errors in data stored in the memory of a computer are detected prior to use of the data. A protected data type is declared in writing a program in which errors in critical data must be detected before the data are used. The invention is preferably implemented on a personal computer system (10) or in a microcontroller for a device. When a protected data item is initialized, both the protected data item and its corresponding bit-inverted form are stored in memory. A constructor function is used to determine the bit-inverted form. Any time that the protected data item is subsequently accessed for use by an application program, either the stored protected data item or its corresponding bit-inverted form are inverted for comparison to the other stored data item. Any difference detected in this comparison indicates that a change has occurred in either or both of the protected data item and its corresponding bit-inverted form within memory. Depending upon the application program in which the invention is used, an appropriate action is taken upon detecting such an error, such as providing an indication of the error and terminating further execution of the program.

20 Claims, 6 Drawing Sheets

METHOD AND SYSTEM FOR USING INVERTED DATA TO DETECT CORRUPT DATA

FIELD OF THE INVENTION

This invention generally relates to the detection of corrupt data stored in a computer memory, and more specifically, to a method and system that is used to detect errors in such data before the data is used in a computation.

BACKGROUND OF THE INVENTION

Many people wrongly believe that computers are infallible in carrying out mathematical computations. Others assume that unless errors have been made in entering data or in writing a program that uses the data, computations and logic implemented by a computer can be relied upon as being accurate. Unfortunately, that assumption is incorrect because it ignores other sources of error, including errors that arise in hardware. For example, it was recently announced that the floating point portion of a central processing unit (CPU) used to implement mathematical computations may introduce errors in the result due to a previously undetected "bug" in the logic implemented by the device.

The present invention is involved with yet another source of error that can affect computations made with a computer. Prior to use in a computation, data are typically stored within the memory of a computer. Typically, the data will be held in non-volatile storage, such as read only memory (ROM), or on a hard drive or floppy disk, until needed in a computation or in some other aspect of a program being executed on the computer. When needed in a program, the data will normally be transferred into random access memory (RAM), whereupon the CPU will carry out a mathematical operation, such as adding the data value to another data value, producing a result that will be temporarily stored in RAM or subsequently transferred to non-volatile storage.

The manner in which data are used by a computer is controlled by the machine language steps. These machine language steps are often produced by compiling or interpreting a program written in a high level language, such as C++. The program determines which data values are used, how the data are used, and what is done with any computational results derived from the data. However, before being used by the CPU, the data may become corrupted, either in non-volatile storage or in the RAM of the personal computer.

Errors in data stored in memory (RAM) may arise for several reasons. Memory can be adversely affected by exposure to high levels of radiation, static discharge, or other ambient conditions, causing corruption of the data stored therein. In such cases, the memory will typically be set to all binary zeroes or ones. A memory chip may also fail for no apparent reason, causing errors in some or all of the data stored within the chip. Stack overflow or errors in programming can also cause data stored in memory to be lost and/or overwritten.

In some applications, errors in one or two bits of the data stored in memory may be of little consequence. For example, graphic images would generally not be noticeably affected if only one or two bits in the image data were corrupted. However, if the data are used in critical application such as controlling medical equipment, it may be essential to detect any errors before the corrupt data can lead to possibly life threatening consequences.

The simplest approach for detecting data errors is to make a copy of each data item and then to compare the two copies periodically to determine if an error in the memory in which they are stored has caused one of the copies to differ from the other. However, a memory failure that causes all of the bits stored in one or more memory chips to be set to either binary zeroes or ones may not be detected by this method, since both copies of the data element will be affected by the corruption in the same manner.

More sophisticated conventional techniques for detecting errors in data include use of cyclic redundancy check (CRC) values that must be determined when the data are stored and then periodically checked. The CRC values are determined using relatively complex polynomial formulas. Any change in the data can be detected if the CRC value subsequently determined differs from the previous CRC value for the data. A similar technique employs checksums to detect changes in the data stored in memory. The checksum previously determined for the data is compared to a subsequent checksum, and an error is detected if the two checksum values differ.

Both of these prior art methods have several common disadvantages. One of the more significant disadvantages, particularly when using a relatively less efficient CPU, is the computational overhead imposed on the processor to determine the CRC value or checksum. Another problem is the additional programming complexity required to allocate data items that will be checked by one of these methods and to ensure that the data items are periodically checked for errors when the program executes. Finally, since either of the prior art methods is normally done only on a periodic basis, a data error may arise after the last check was made and remain undetected when the data item is next used in a computation.

What is needed is a technique for detecting critical data errors that can be implemented with relatively minimal computational overhead and without requiring significant programming effort to ensure that the critical data are only checked for errors immediately before the data are used in a program. Such a technique should impose very little burden on the programmer to implement, should be more efficient than the prior art methods, and should be completely reliable. However, it should not be expected that any new technique intended to detect errors in data stored in memory will also be able to detect errors that arise in the computational process due to defects in the CPU or mistakes in the program.

SUMMARY OF THE INVENTION

In accordance with the present invention, a method is defined for detecting an error in a data item. The method includes the steps of using a constructor function to determine an inverted data item corresponding to the data item when the data item is stored in memory. The inverted data item is also stored in memory, in association with the data item. When the data item is required in a program, both the data item and the inverted data item are recalled from memory. Next, the data item is compared with the inverted data item before being used by the program. If the data item no longer corresponds to the inverted data item, the method provides for indicating that an error has occurred in either the data item or the inverted data item.

In one embodiment, the method further includes the step of inverting the data item to produce a test inverted data item for comparison to the inverted data item. In another embodiment, the method instead includes the step of inverting the inverted data item to produce a test data item for comparison to the data item. For this embodiment, the method preferably uses a (user-defined) conversion function operator to carry out the inversion of the inverted data item. In addition, the conversion function operator is preferably reentrant to enable sharing of the operator between a plurality of tasks in which a plurality of other inverted data items are used.

Also included in the method is the step of declaring a data item type for the data item to indicate that it has an inverted data item associated with it. Further, the steps of using the constructor function to determine the inverted data item, storing the data item and the inverted data item in memory, recalling the data item and inverted data item from memory, comparing the data item with the inverted data, and indicating that an error has occurred if the data item no longer corresponds to the inverted data item are implemented automatically for each data item that is declared to be of the type having the inverted data item associated with it.

A further aspect of the present invention is directed to a system for detecting an error in a data item before the data item is employed in a computation. The system includes a computer for implementing the computation that employs the data item. The computer includes a CPU that carries out program steps to detect an error in the data item. A memory is included in the computer for storing the data item and for storing machine instructions that control the CPU and determine the program steps implemented by the CPU. In addition, the computer includes a data bus that couples the memory to the CPU. The machine instructions cause the CPU to use a constructor function to determine an inverted data item corresponding to the data item when the data item is stored in the memory. The inverted data item is then stored in the memory in association with the data item. Further, the machine instructions cause the CPU to recall the data item and the inverted data item from the memory when the data item is next required by the CPU, and to compare the data item with the inverted data item before either is used. In addition, the CPU is caused to indicate that an error has occurred in either the data item or the inverted data item, if the data item no longer corresponds to the inverted data item.

Other functions implemented by the CPU in response to the machine instructions are generally consistent with the steps described above in connection with the method.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1:
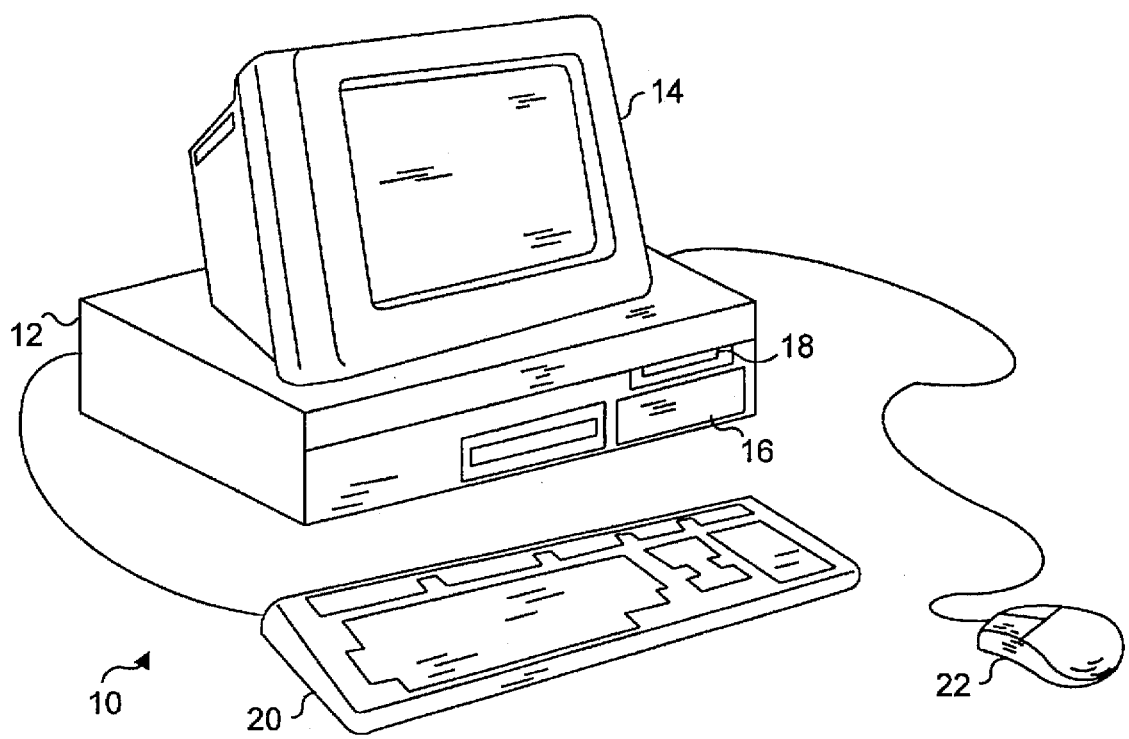
FIG. 1 is an isometric view of a personal computer system in which the present invention is implemented.

The present invention is intended to be implemented in a microcontroller (not shown) or on a computer such as a personal computer 10, which is illustrated in FIG. 1. Personal computer 10 is generally conventional in design, including a processor chassis 12 in which internal hardware components of the personal computer system are disposed. On top of processor chassis 12 is a display monitor 14, the resolution and color capabilities of which are not particularly relevant in connection with the present invention. A hard drive 16 and a floppy drive 18 are mounted in the front panel of the processor chassis, providing fixed non-volatile memory for storing application programs, other files, and data. Floppy drive 18 enables personal computer 10 to read and write files and/or data on floppy disks (not separately shown).

A keyboard 20 is coupled to processor chassis 12, enabling a user to input data and instructions that control programs executing on personal computer 10. Operator input to the system is also provided using a mouse 22 or other pointing device that controls a cursor on display monitor 14; the cursor can be positioned by the user to select menu items and graphic objects presented on the display monitor.

Figure 2:
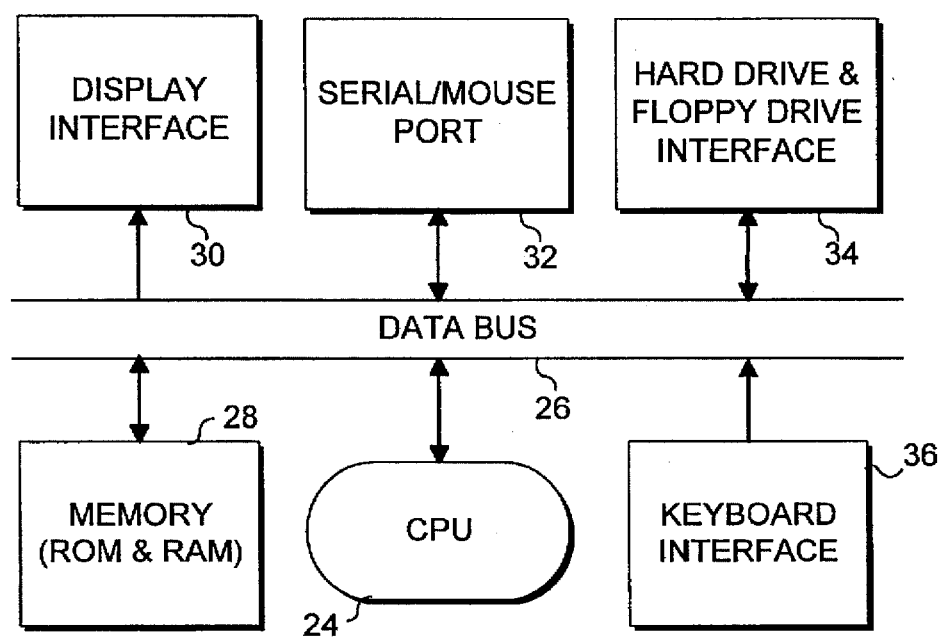
FIG. 2 is a block diagram of the internal components within a processor chassis of the personal computer shown in FIG. 1.

FIG. 2 illustrates conventional components included within processor chassis 12, some of which are used in connection with implementing the present invention. A CPU 24 is provided for carrying out machine instructions that implement program steps in applications running on personal computer 10. CPU 24 is coupled to a data bus 26, as are other components including a memory 28. Memory 28 includes both read only memory (ROM) and random access memory (RAM). The machine instructions required for the initial bootup of personal computer 10 are stored in ROM. Volatile storage is provided for machine instructions that are loaded when applications are run and for storing variables and other data required to execute such programs. A display interface 30 is used to drive display monitor 14 in response to video data transferred to the display interface from data bus 26. Also coupled to the data bus are a serial/mouse port 32, a hard drive and floppy drive interface 34, and a keyboard interface 36. The function of each of the components illustrated in FIG. 2 in regard to their use in personal computer 10 are well known to those of ordinary skill in the art, and need not be discussed further to provide an enabling disclosure of the present invention. It should be noted that various types of CPUs can be used in the present invention other than those typically used within personal computers. For example, if the present invention is implemented in a controller for other devices, CPU 24 and memory 28 can be replaced by a micro controller (not shown) that incorporates both of these functional components.

In FIG. 1, personal computer 10 is illustrated as a desktop system; however, the present invention can be implemented on virtually any type of computer, including laptops and workstations on a network. It is also readily implemented in a microcontroller used to control a hardware device such as a medical component. Although a microcontroller embodiment of the invention is not shown in the figures, these devices are so well known in the field of control technology that there is no need to provide details about that embodiment. Operatively, the micro controller embodiment functions in much the same manner as the embodiment that executes in a program on personal computer 10. Furthermore, it should be noted that the present invention can be included in a variety of different application programs, without limitation as to type. Virtually any program that uses data can benefit from incorporating the present invention to detect errors in the data before the erroneous data is used.

Figure 3:
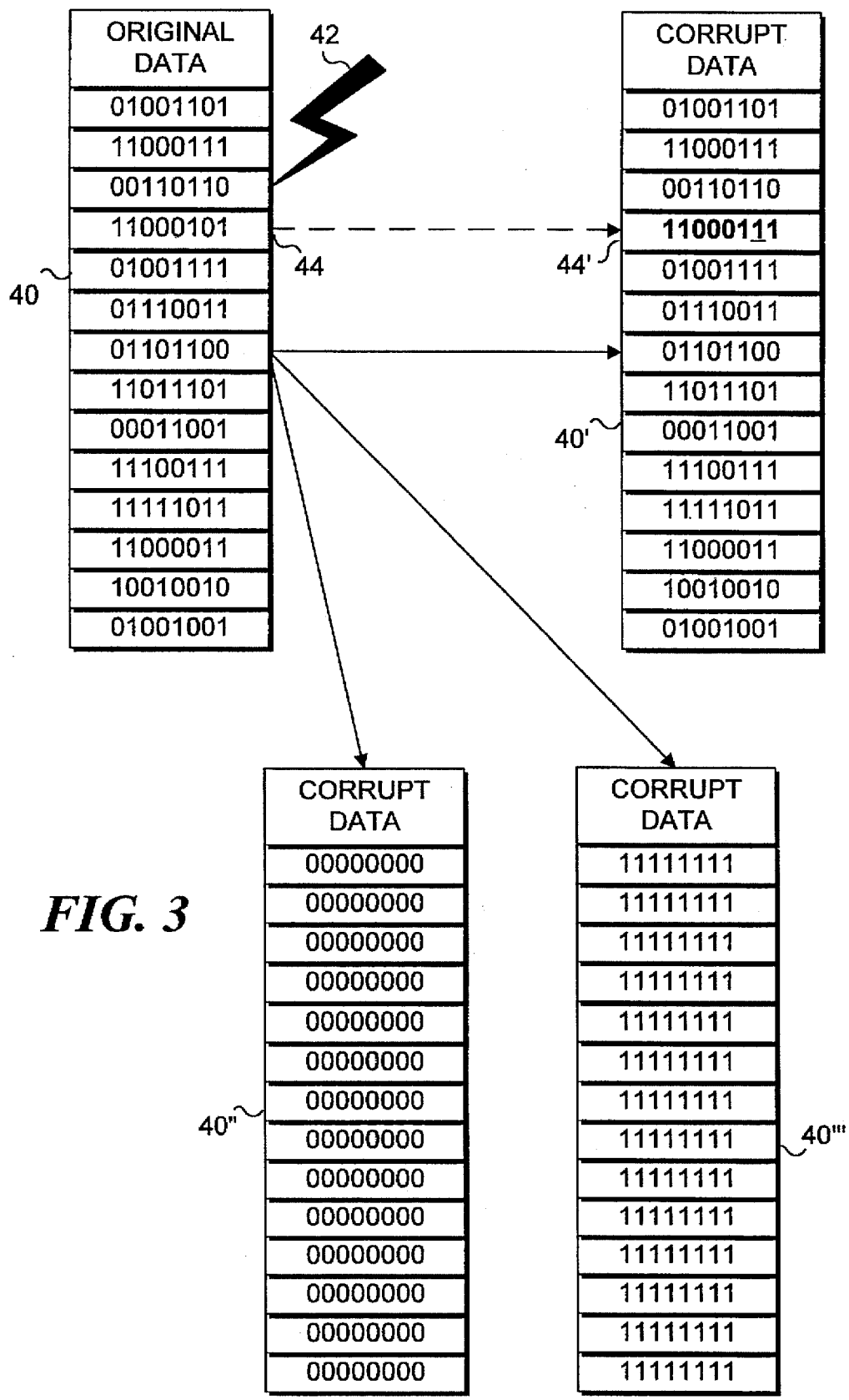
FIG. 3 is a block diagram that illustrates a plurality of memory cells, showing several different ways in which the data stored in the memory cells can be corrupted.

As explained above in the Background of the Invention, data stored within the memory of a microcontroller or a computer such as personal computer 10 are subject to corruption due to various causes. FIG. 3 provides several examples showing some of the ways in which the data stored in memory can be corrupted. In this Figure, a plurality of memory cells 40 are illustrated to show the bytes of data originally stored in binary form in the memory, prior to experiencing at least some corruption due to the effects of a static discharge or radiation, which is represented by a lightning bolt 42. In the first example of corruption, the byte stored in a single memory cell 44 is changed in memory cells 40'. In the byte stored in a memory cell 44', the second least significant bit (LSB) of data has changed. Specifically, as originally stored, memory cell 44 contains the binary value "11000101;" this value is changed in memory cell 44' to "11000111." (The corrupted bit is underlined to more clearly indicate the change that has occurred.)

In the second example of data corruption shown in FIG. 3, the data contained in memory cells 40" have all been set to zeroes as a result of the static discharge or radiation. Alternatively, the effect of the static discharge or radiation may cause all of the data to be set to binary ones, as indicated in memory cells 40'". It should be apparent that the corrupt data conditions shown in memory cells 40" and in 40'" would preclude comparison of two copies of data originally stored in memory, since after the corruption, both copies would be affected in the same manner, precluding detection of the corruption.

In contrast, the present invention avoids this problem by storing critical data items in memory in both their standard form and in their bit-inverted (mirror) form. When a data item is inverted, each binary bit of the data item is changed to the opposite binary value, i.e., each binary zero is changed to a binary one, and each binary one is changed to a binary zero. Thus, for example, the bit-inverted value of "10010010" is "01101101." Before the data item is subsequently used in a computation or for some other purpose by an application program, the data item must first be obtained from its memory storage location. It is then either inverted and compared to its previous bit-inverted form, or the previously bit-inverted data item is obtained from memory and inverted to obtain the standard form for comparison to the data item just obtained from memory. A change in either data item originally stored or in the corresponding bit-inverted form originally stored will thus be detected, due to a difference between the two values that are compared.

Figure 4:
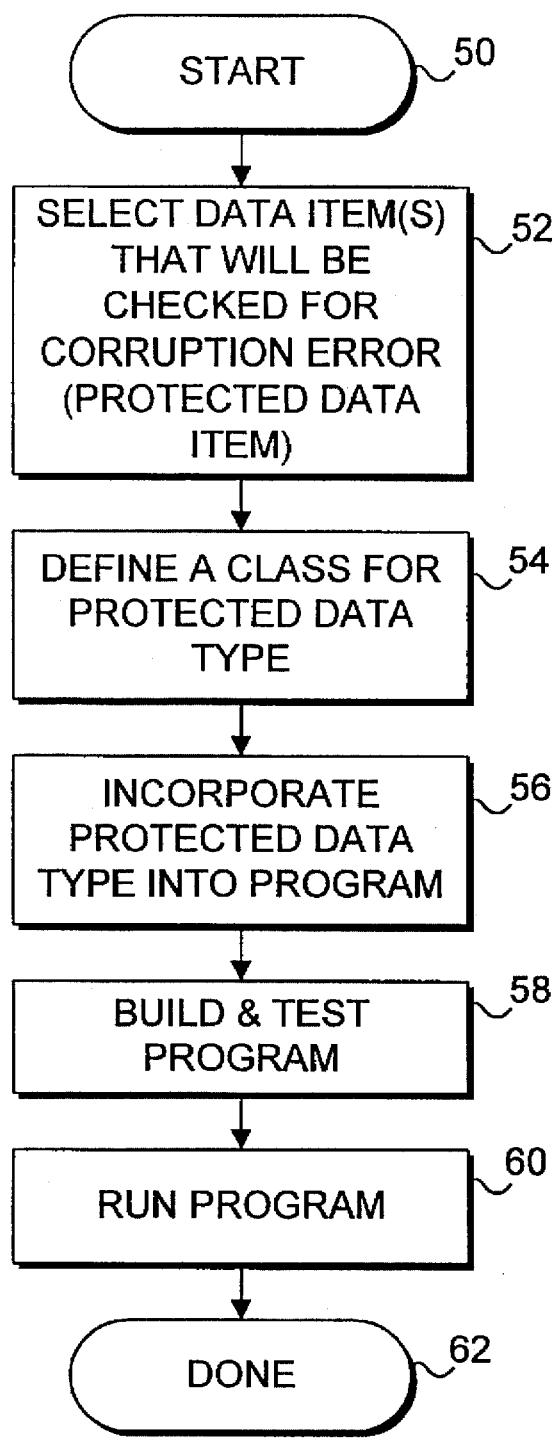
FIG. 4 is a flow chart that illustrates an overview of the logical steps implemented in carrying out the present invention.

In FIG. 4, an overview of the steps involved in the present invention are presented in a flow chart that begins at a start block 50. In a block 52, a selection is made of the data item(s) that will be checked for corruption or error. In many instances, much of the data used in the program is not sufficiently critical to justify the additional storage overhead required to store the inverted form of the data or the computational overhead (though slight) required to detect errors in the data. The user will thus only select those data items that are of critical importance in a program as "protected data items," i.e., the data items that will be checked for errors using the present invention.

Figure 5:
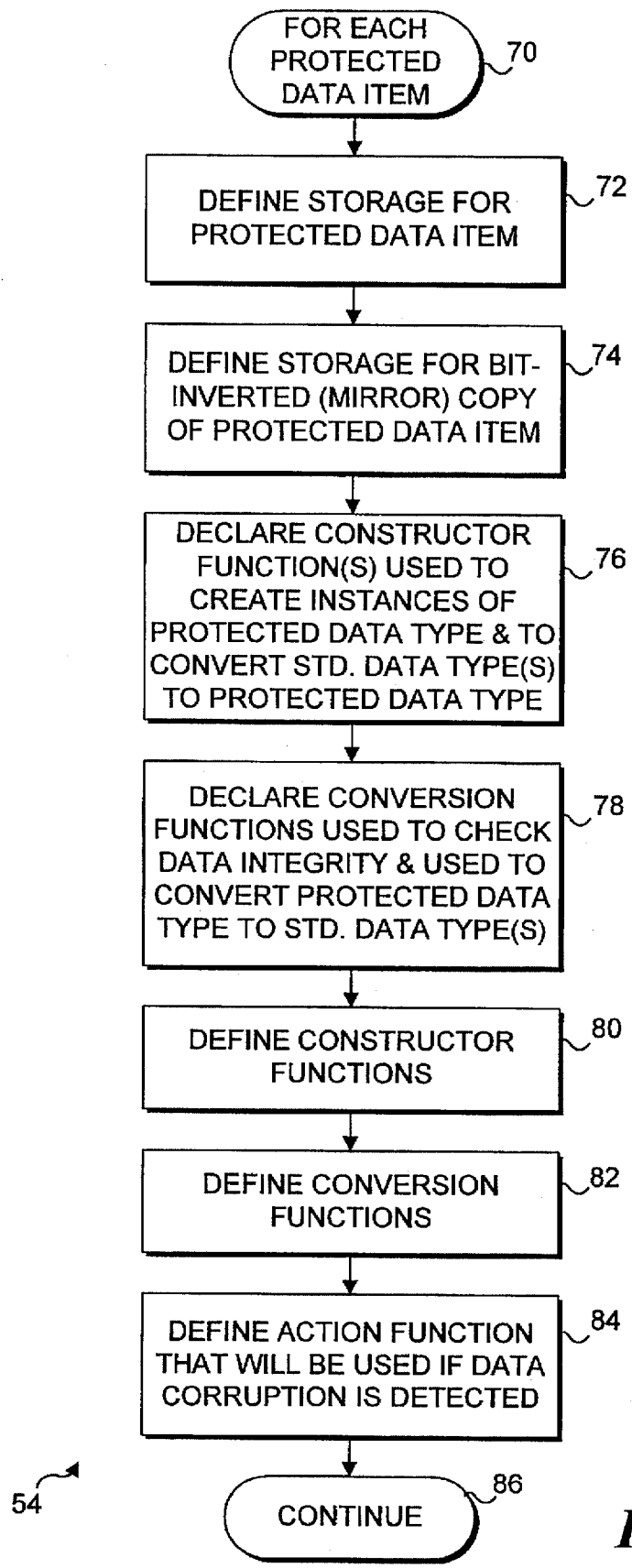
FIG. 5 is a flow chart that shows details of the steps implemented in defining a class for a protected data type.

In a block 54, the user defines a class (or user-defined data type) for the protected data type. Details of the logic involved in carrying out this step are illustrated in the flow chart of FIG. 5, beginning at a block 70. As noted in that flow chart, for each protected data type, the user carries out the indicated steps, beginning with the step of defining storage for the protected data item, as provided in a block 72. In this step, the user will insure that appropriate memory storage is set aside for each protected data item. This same step would be required for any data item to insure that appropriate and adequate memory is allocated for the data item. In a block 74, the user defines storage required for the bit-inverted (mirror) copy of the protected data item, which is also stored in memory in association with the protected data item from which it was produced.

The present invention is preferably implemented in the C++ language. One of the advantages of using this language is its inclusion of constructor functions. In a block 76, the logic provides for declaring the constructor function(s) used to create an instance or "single usage" of the protected data type and used to convert standard data types (integer, floating point, etc.) to the protected data type. In the C++ language, the constructor function efficiently carries out this task with a minimal amount of processor overhead (cycles).

Another capability included within C++ (and other) languages is the provision of conversion functions used to convert between data types. A conversion function is declared for the protected data type to encompass the conversion of the protected data type to the various standard data types that will be used in a program. Once the conversion function is defined, it is not necessary for the programmer to explicitly include programming steps in order to implement the functions of the conversion each time that the protected data item is required for use in the application program. Instead, these steps will be automatically implemented by the language. An example of a header file for defining a mirror_int class is as follows.

```
class mirror_int
{
private:
    int value;              //integer value
    int mirror_value;       //inverted mirror of integer value
public:
    mirror_int(int);        //constructor
    //normal member functions
    void store(int new_value); //store new value and its mirror
    void compare(void);     //compare the value with its mirror
    int get(void);          //get the value
    //conversion functions
    operator int( );        //to convert mirror_int to an integer
};
```

In a block 78, the user declares the conversion functions employed to check data integrity as part of converting the protected data type to one or more standard data types. In blocks 80 and 82, respectively, the user next defines the specific constructor functions and conversion functions required. An example of the constructor function and conversion function for dealing with integer data is presented below.

```
//CONSTRUCTOR
mirror_int::mirror_int(int value)
{
    store (value);
}
```

-continued

```
//NORMAL MEMBER FUNCTIONS
void mirror_int::store(in new_value)
{
        value = new_value;
        mirror_value = ~new_value;
}
void mirror_int::compare(void)
{
        char *error_string="                              ";
        if(value != ~mirror_value)
        {   sprintf(error_string, "Corrupted mirror_int %p: %d =
                %d",
this,
                                                value,
~mirror_value);
                //CALL ERROR HANDLING FUNCTION
                system_error(error_string);
        }
}
int mirror_int::get(void)
{
        int temp = value;
        compare( );
        return temp;
}
//CONVERSION FUNCTIONS
mirror_int::operator int( )
{
        return (get( ));
}
```

A block 84 provides for defining an action function that will be used if any data corruption is detected in a protected data item. In this step, the user may provide that a warning message will be displayed and/or that further execution of the application in which the present method is used will be interrupted. However, the specific response to detection of data corruption will depend upon the particular application program in which the present invention is used. Thereafter, the logic continues in a block 86, returning to the overview shown in FIG. 4.

Figure 6:
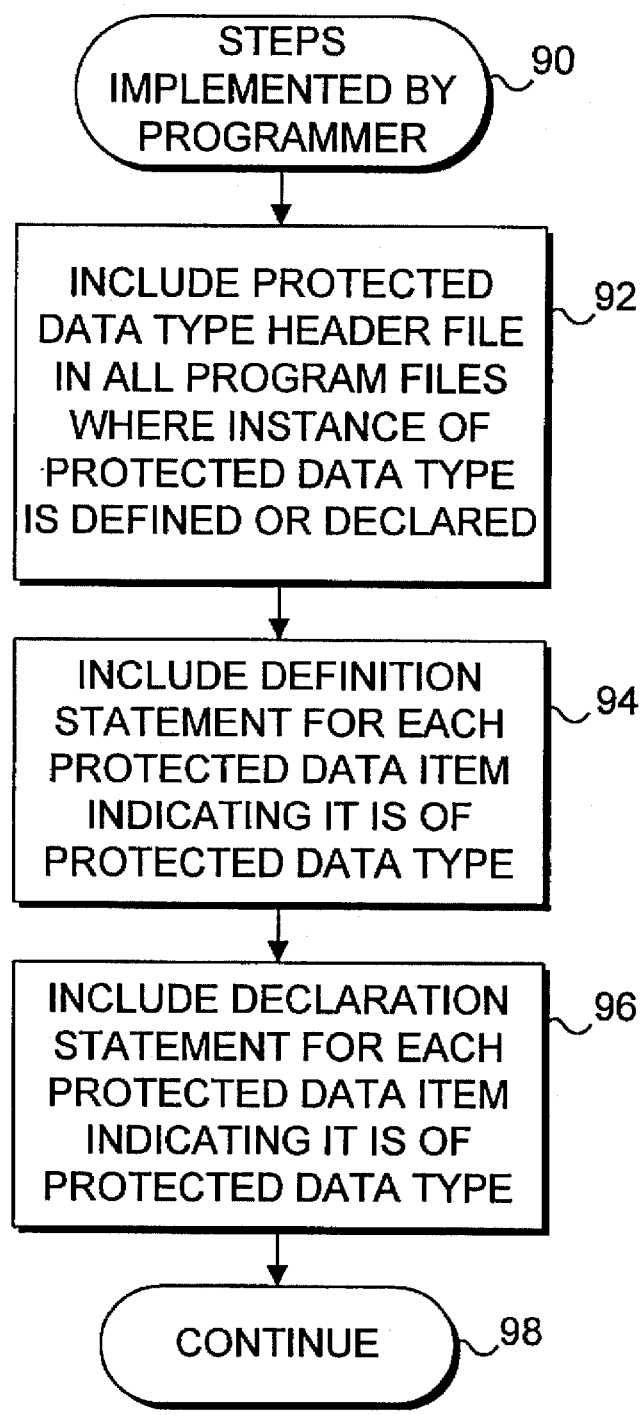
FIG. 6 is a flow chart showing the steps implemented by a programmer to incorporate a protected data type into a program.

Referring back to FIG. 4, a block 56 provides for incorporating the protected data type into the program or application in which the present invention is employed. Further details of this step are illustrated in FIG. 6, beginning with a block 90, which indicates that the following steps are implemented by the programmer writing the application program in which the present invention is incorporated.

In a block 92, the programmer includes the protected data type header file in all program files where instances of the protected data type are defined or declared. This step will be apparent to those of ordinary skill in the programming arts, since the appropriate header file must be included for each of the functions of the programming language that are used in a program.

In a block 94, the programmer includes definition statements for each protected data item, indicating that the item is of the protected data type. Finally, in a block 96, the programmer must include a declaration statement for each protected data item used outside of the scope of the definition, indicating that the item is of the protected data type. The logic continues in a block 98, returning to the general overview shown in FIG. 4.

The next step in FIG. 4 is in a block 58. This step provides for building and testing the program in which the present invention is employed. Since this step has little to do with the present invention other than to insure that related programming bugs are detected and corrected, further details of block 58 are not provided.

Figure 7:
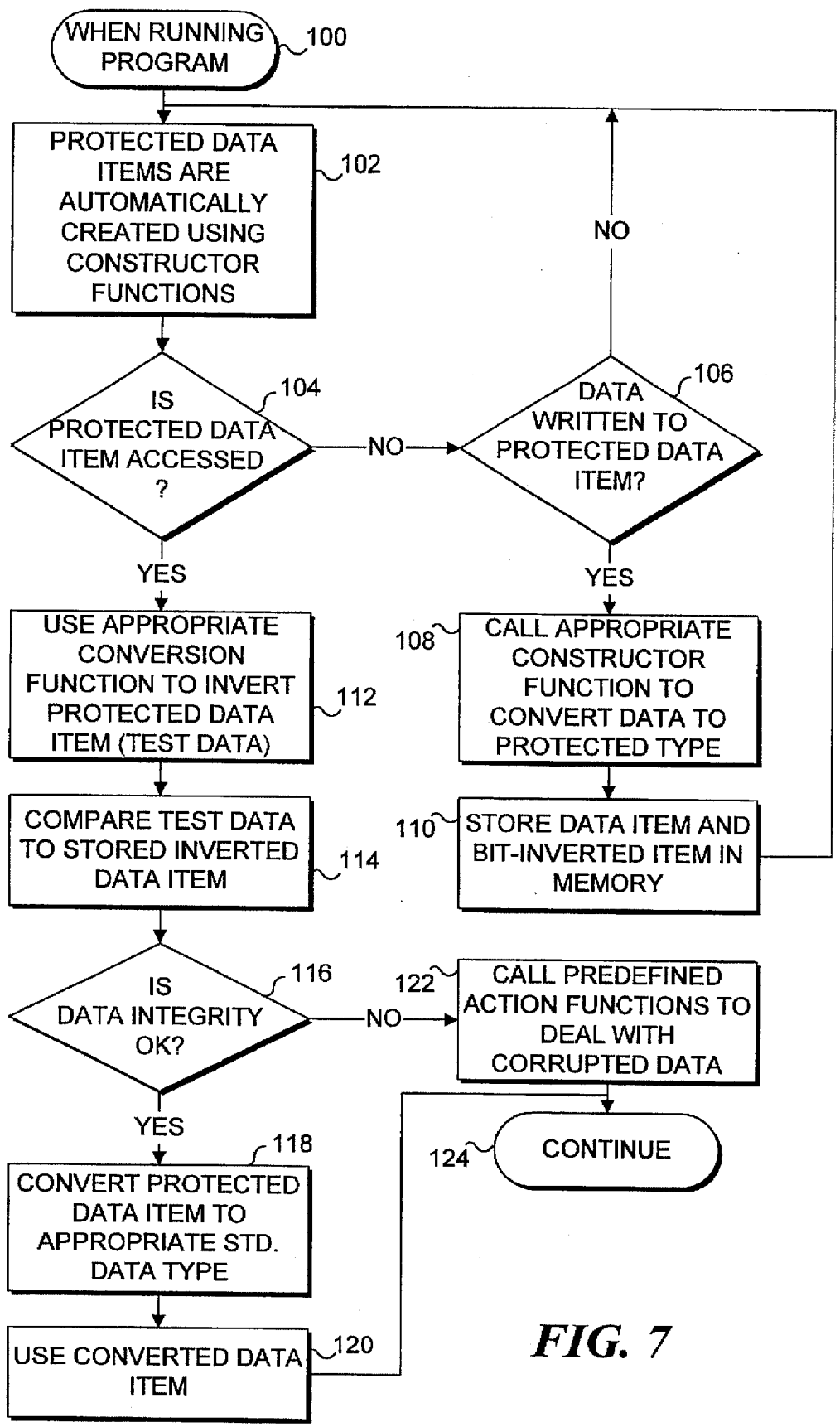
FIG. 7 is flow chart that illustrates the logic implemented to check the integrity of protected data when a program in which the present invention is used is implemented.

A block 60 indicates that the program successfully built and tested is run by executing it on the CPU. Further details of the steps that are implemented in connection with the present invention when running a program in which it is incorporated are shown in FIG. 7, starting at a block 100. In a block 102, the protected data items are automatically created using the constructor functions. Since the constructor functions define data elements of the protected data types as comprising both a protected data item and the corresponding bit-inverted data item, creation and storage of these data items are handled seamlessly by the constructor function during execution of the application program.

FIG. 7 does not show any of the other steps implemented when running a specific application program that includes the present invention. Instead, only those steps involving the present invention are illustrated. For example, a decision block 104 determines if a protected data item is being accessed by the program. If not, a decision block 106 determines if data are being written to a protected data item. A negative response to both of these decision blocks leads back to block 102. However, if data are being written to a protected data item, a block 108 provides for calling the appropriate constructor function to convert the data to the protected data type. Thus, a floating point variable is converted to the protected data type if the floating point variable is assigned to a protected data item. A block 110 calls for storing a protected data item and its associated bit-inverted data item in memory (in RAM). The logic thereafter returns to block 102.

Returning to decision block 104, if a protected data item is being accessed by the program, a block 112 indicates that the appropriate conversion function should be used to invert the protected data item (producing test data for purposes of a comparison). Implicit within block 112 is the retrieval of the protected data item from memory where it was stored. Next, in a block 114, the test data resulting from inverting the protected data item that was just accessed from memory is compared to the stored inverted data item, which was retrieved from memory. A change in either the protected data item or its corresponding bit-inverted data item within memory will be apparent from this comparison. Alternatively, step 112 can be rewritten to provide for inverting the stored inverted data item to produce the test data and the step in block 114 can be rewritten to compare the test data with the stored protected data item. The results of either comparison are equivalent.

In a decision block 116, the CPU determines if the data integrity is okay. In other words, any difference between the test data and the value to which it is compared will indicate that an error has occurred in one of the two data values leading to a negative result from decision block 116. In most cases, however, the two values compared will be equal, leading to a block 118, which provides for converting the protected data item to the appropriate standard data type for use in the program. Subsequently, a block 120 indicates that the converted data item is used in the program.

The logic thereafter proceeds to a block 124, which indicates that the steps shown in FIG. 4 are continued. A negative response to decision block 116, indicating that an error has been detected in the data that was stored in memory causes the logic to proceed to a block 122. In block 122, the predefined action function(s) previously created to respond to corrupt data are implemented. These functions will likely alert the operator and/or take any other appropriate response, depending upon the particular program application involved. Thereafter, the logic may proceed to block 124. Referring back to FIG. 4, a block 62 indicates that the program, which includes the present invention, is done or otherwise terminated, concluding the flow of logic.

Although the present invention has been described in connection with the preferred form of practicing it, those of ordinary skill in the art will understand that many modifications can be made thereto within the scope of the claims that follow. Accordingly, it is not intended that the scope of the invention in any way be limited by the above description, but instead be determined entirely by reference to the claims that follow.

The invention in which an exclusive right is claimed is defined by the following:

1. A method of detecting, using a computer, an error in a data item selected from a plurality of data items, comprising the steps of:
    (a) providing a software library of functions that includes a constructor function, a conversion function, an error handling function, and a program including machine instructions defining program steps to be implemented by said computer;
    (b) employing the constructor function to associate a protected data type with the data item, store the data item into a memory, determine an inverted data item corresponding to the data item that is stored in the memory, and store said inverted data item into the memory in association with the data item to which it corresponds;
    (c) recalling the data item and the inverted data item from the memory when the data item is required in the program that is executed by the computer;
    (d) comparing the recalled data item with the recalled inverted data item before either is used by the program so that a correspondence can be determined between said data items; and
    (e) indicating that an error in one of the data item and the inverted data item that are recalled from the memory has occurred with the error handling function if the data item no longer corresponds to the inverted data item, else if the data item and the inverted data item correspond to each other, employing the conversion function to associate the data item with a non-protected data type, so that the data-item can be used by the program.

2. The method of claim 1, wherein the step of employing the constructor function further comprises the step of identifying the data item as a protected data item that will be checked for error, from among a plurality of possible data items used by the program.

3. The method of claim 1, wherein the step of employing the constructor function further comprises the step of inverting the data item to produce a test inverted data item for comparison to the inverted data item.

4. The method of claim 1, wherein the step of employing the constructor function further comprises the step of inverting the inverted data item to produce a test data item for comparison to the data item.

5. The method of claim 4, wherein the step of inverting the inverted data item comprises the step of using the conversion function to implement the inversion.

6. The method of claim 5, wherein the conversion function is shared between a plurality of tasks in which a plurality of other inverted data items are used.

7. The method of claim 1, further comprising the step of declaring a protected data type for the data item that indicates the data item has an inverted data item associated with it.

8. The method of claim 7, wherein steps (a) and (d) are implemented automatically for each selected data item that is declared to be of the type having the inverted data item associated with it.

9. A method of detecting, using a computer, an error in a data item, selected from a plurality of data items, comprising the steps of:
    (a) declaring the data item as a protected data type;
    (b) providing a software library of functions that includes a constructor function, a conversion function, an error handling function, the constructor function, and a program including machine instructions defining program steps to be implemented by said computer being employed to associate the data item with a protected data type;
    (c) employing the constructor function to create an inverted data item corresponding to the data item, when the data item is associated with the protected data type by the constructor function;
    (d) storing the data item and the inverted data item into the memory, said data item being stored into the memory in association with the inverted data item to which it corresponds;
    (e) prior to using the data item with the program recalling the data item and the inverted data item from the memory and determining whether the recalled data item and the recalled inverted data item correspond to each other; and
    (f) providing an indication of an error in one of the data item and the inverted data item with the error handling function if the data item and the inverted data item are recalled from memory and do not correspond to each other, else if said data item and the inverted data item correspond to each other, employing the conversion function to associate the data item with a non-protected data type, so that the data item can be used by the program.

10. The method of claim 9, wherein the step of determining whether the data item and the inverted data item that are recalled from memory correspond to each other comprises the steps of inverting the data item to produce a test inverted data item; and, comparing the test inverted data item with the inverted data item previously stored in the memory.

11. The method of claim 9, wherein the step of determining whether the data item and the inverted data item that are recalled from memory correspond to each other comprises the steps of inverting the inverted data item to produce a test data item; and, comparing the test data item with the data item previously stored in the memory.

12. The method of claim 11, wherein the step of inverting the inverted data item comprises the step of using the conversion function to effect the inversion.

13. The method of claim 12, wherein the conversion function is shared between a plurality of tasks in which a plurality of other inverted data items are included.

14. The method of claim 9, wherein steps (c) through (e) are implemented automatically for each selected data item declared as the protected type.

15. A system for detecting an error in a data item selected from a plurality of data items, before the data item is employed in a computation, comprising:
    (a) a computer for implementing the computation that employs the data item, said computer including:
        (i) a central processing unit that carries out program steps to detect an error in the data item;
        (ii) a memory for storing the data item, a software library having a plurality of functions, and machine instructions that control the central processing unit and define the program steps implemented by the central processing unit; and (iii) a data bus that couples the memory to the central processing unit; and (b) said machine instructions causing the central processing unit to:

(i) access the software library;

(ii) determine an inverted data item corresponding to the data item when the data item is stored in the memory, said inverted data item also being stored in the memory in association with the data item;

(iii) recall the data item and the inverted data item from the memory when the data item is next required by the central processing unit;

(iv) compare the data item with the inverted data item before either is used by the central processing unit; and (v) indicate that an error in one of the data item and the inverted data item has occurred if the data item that is compared to the inverted data item no longer corresponds to the inverted data item, else if said data item corresponds to said inverted data item, enabling the central processing unit to use said data item.

16. The system of claim 15, wherein the program steps implemented by the central processing unit employ a constructor function from the software library to determine the inverted data item when the data item is initialized and stored in the memory.

17. The system of claim 15, wherein the program steps implemented by the central processing unit invert the inverted data item to produce a test data item for comparison to the data item.

18. The system of claim 17, wherein the program steps implemented by the central processing unit to invert the inverted data item use a conversion function from the software library.

19. The system of claim 18, wherein the conversion function is shared between a plurality of tasks implemented by the central processing unit, said plurality of tasks including a plurality of other inverted data items.

20. The system of claim 15, wherein a specific data type declared for the data item in defining the program steps, indicates that the data item has an inverted data item associated with it.

* * * * *

UNITED STATES PATENT AND TRADEMARK OFFICE
CERTIFICATE OF CORRECTION

PATENT NO. : 5,699,509
DATED : December 16, 1997
INVENTOR(S) : Gary et al.

It is certified that error appears in the above-indentified patent and that said Letters Patent is hereby corrected as shown below:

Column 10, line 2, change "data item, selected" to
--data item selected--.

Signed and Sealed this

First Day of September, 1998

Attest:

BRUCE LEHMAN

Attesting Officer

Commissioner of Patents and Trademarks